(12) United States Patent
Lee et al.

(10) Patent No.: US 11,864,429 B2
(45) Date of Patent: Jan. 2, 2024

(54) ORGANIC LIGHT EMITTING PANEL AND ORGANIC LIGHT EMITTING DISPLAY DEVICE INCLUDING THE SAME

(71) Applicant: LG DISPLAY CO., LTD., Seoul (KR)

(72) Inventors: Younghee Lee, Paju-si (KR); HyunHaeng Lee, Paju-si (KR); HyoBin Choi, Paju-si (KR)

(73) Assignee: LG Display Co., Ltd., Seoul (KR)

(*) Notice: Subject to any disclaimer, the term of this patent is extended or adjusted under 35 U.S.C. 154(b) by 215 days.

(21) Appl. No.: 17/536,144

(22) Filed: Nov. 29, 2021

(65) Prior Publication Data
US 2022/0199718 A1 Jun. 23, 2022

(30) Foreign Application Priority Data
Dec. 22, 2020 (KR) .................. 10-2020-0180932

(51) Int. Cl.
| | |
|---|---|
| H01L 29/08 | (2006.01) |
| H10K 59/123 | (2023.01) |
| H10K 59/121 | (2023.01) |
| G09G 3/3266 | (2016.01) |
| G09G 3/3275 | (2016.01) |
| H01L 29/786 | (2006.01) |
| G09G 3/3233 | (2016.01) |
| H01L 27/12 | (2006.01) |

(52) U.S. Cl.
CPC ....... *H10K 59/123* (2023.02); *H10K 59/1213* (2023.02); *H10K 59/1216* (2023.02); *G09G 3/3233* (2013.01); *G09G 3/3266* (2013.01); *G09G 3/3275* (2013.01); *G09G 2300/0426* (2013.01); *G09G 2300/0842* (2013.01); *G09G 2310/08* (2013.01); *H01L 27/1225* (2013.01); *H01L 27/1255* (2013.01); *H01L 29/7869* (2013.01)

(58) Field of Classification Search
CPC ............. H10K 59/123; H10K 59/1213; H10K 59/1216
USPC ........................................................ 257/40
See application file for complete search history.

(56) References Cited

U.S. PATENT DOCUMENTS

| 2018/0182836 A1* | 6/2018 | Beak ................... H10K 59/1216 |
| 2019/0115561 A1* | 4/2019 | Tang .................... H10K 59/124 |

* cited by examiner

*Primary Examiner* — Phuc T Dang
(74) *Attorney, Agent, or Firm* — Polsinelli PC

(57) ABSTRACT

A display panel of an organic light emitting display device includes a buffer layer disposed on a first conductive layer, and including a first contact hole, an active layer disposed on the buffer layer, and including an active pattern and a conductive pattern disposed on the active pattern, a first insulating film disposed on or over the active layer and the buffer layer, and including a second contact hole overlapping with the first contact hole, a second conductive layer disposed on the first insulating film, and contacting the first conductive layer through the first contact hole and the second contact hole, a plate disposed in the same layer as the second conductive layer, and spaced apart from the second conductive layer, and each of the first conductive layer, the active layer, and the plate serves as an electrode of a storage capacitor, thereby implementing a high-capacity storage capacitor for the display panel.

20 Claims, 14 Drawing Sheets

ORGANIC LIGHT EMITTING PANEL AND ORGANIC LIGHT EMITTING DISPLAY DEVICE INCLUDING THE SAME

CROSS-REFERENCE TO RELATED APPLICATION

This application claims the priority benefit Republic of Korea Patent Application No. 10-2020-0180932, filed on Dec. 22, 2020, which is hereby incorporated by reference in its entirety.

BACKGROUND

Field of the Disclosure

The present disclosure relates to an organic light emitting display panel and an organic light emitting display device including the display panel.

Description of the Background

Organic light emitting display devices include one or more thin film transistors (TFT), a storage capacitor, and a plurality of lines.

One or more thin film transistors, a capacitor, and one or more lines are sometimes implemented as fine patterns on substrate included in the organic light emitting display device, and the display device can operate based on complicate connections between one or more thin film transistors, at least one capacitor, and one or more lines.

Recently, there are growing needs for organic light emitting display devices with high luminance and high resolution, and to satisfy such needs, it is desirable to implement an efficient space arrangement and connection structure between elements included in the organic light emitting display devices is in progress.

SUMMARY

The present disclosure relates to an organic light emitting display panel having high luminance characteristics by increasing an area of a light emitting area without reducing an area of a storage capacitor disposed in a non-light emitting area, and an organic light emitting display device including the display panel.

The present disclosure also relates to an organic light emitting display panel having high luminance and high resolution by increasing the capacity of a storage capacitor without reducing an area of a light emitting area, and an organic light emitting display device including the display panel.

The present disclosure also relates to an organic light emitting display panel having a simple process by reducing the number of masks required to form a buffer layer and a first insulating film, and an organic light emitting display device including the display panel.

Further, the present disclosure relates to an organic light emitting display panel for easily driving sub-pixels by enabling an active layer to include an active pattern and a conductive pattern, and an organic light emitting display device including the display panel.

According to one aspect of the present disclosure, an organic light emitting display panel and an organic light emitting display device including the display panel, the display panel includes a substrate, a first conductive layer disposed on the substrate, a buffer layer disposed on the first conductive layer and including a first contact hole, a first active layer disposed on the buffer layer, a first insulating film disposed on or over the active layer and the buffer layer and including a second contact hole overlapping the first contact hole, a second conductive layer disposed on the first insulating film and contacting a part of the first conductive layer and a part of the first active layer through the first contact hole and the second contact hole, a second insulating film disposed on the second conductive layer and including a third contact hole overlapping the first contact hole and the second contact hole, and a third conductive layer disposed on the second insulating film and contacting a part of the second conductive layer through the second contact hole. The first contact hole, the second contact hole, and the third contact hole overlap one another.

According to another aspect of the present disclosure, an organic light emitting display panel and an organic light emitting display device including the display panel, the display panel includes a substrate, a first conductive layer disposed on the substrate, a buffer layer disposed on the first conductive layer and including a first contact hole, an active layer disposed on the buffer layer and including an active pattern and a conductive pattern disposed on the active pattern, a first insulating film disposed on or over the active layer and the buffer layer and including a second contact hole overlapping the first contact hole, a second conductive layer disposed on the first insulating film and contacting the first conductive layer through the first contact hole and the second contact hole, and a plate disposed in the same layer as the second conductive layer and spaced apart from the second conductive layer. Two or more of the first conductive layer, the active layer, and the plate overlap each other to form a storage capacitor.

According to aspects of the present disclosure, as a plurality of contact holes disposed in an area in which a second node of a driving transistor is located overlap, and thus, an area of a conductive layer overlapping with the plurality of contact holes can be reduced. That is, an area of a non-light emitting area can be reduced without reducing an area of a storage capacitor, and thus, by increasing an area of a light emitting area relative to the non-light emitting area by the reduced area of the non-light emitting area, it is therefore possible to provide an organic light emitting display panel having high luminance characteristics and an organic light emitting display device including the display panel.

Further, according to aspects of the present disclosure, as at least two of the plurality of contact holes disposed in the area in which the second node of the driving transistor is located overlap, and thus, an area of a conductive layer overlapping the at least two contact holes can be reduced, a size or capacity of a storage capacitor can be therefore increased without reducing an area of a light emitting area, and as a result, it is possible to provide an organic light emitting display panel having high luminance and high resolution and an organic light emitting display device including the display panel.

Further, according to aspects of the present disclosure, by forming contact holes formed in the buffer layer and the first insulating film through the same process, it is possible to provide an organic light emitting display panel that can be manufactured using a reduced number of marks through a simplified process, and an organic light emitting display device including the display panel.

Further, according to aspects of the present disclosure, as the active layer includes the active pattern and the conductive pattern disposed on the active pattern, it is possible to provide the organic light emitting display panel in which sub-pixels can be easily driven and the organic light emitting display device including the display panel.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
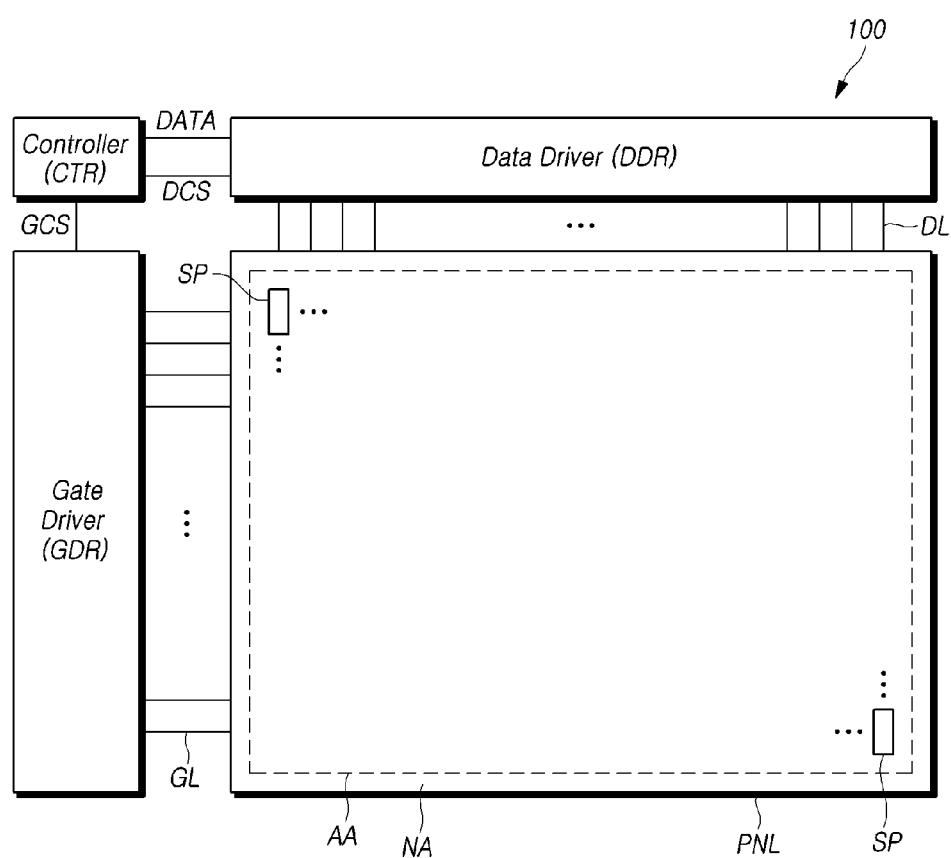
FIG. 1 schematically illustrates a system configuration of an organic light emitting display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

FIG. 1 schematically illustrates a system configuration of an organic light emitting display device according to aspects of the present disclosure.

Organic light emitting display devices according to aspects of the present disclosure may include an organic light emitting display device 100, a lighting device, a light emitting device, and the like. Hereinafter, for convenience of description, organic light emitting display devices according to aspects of the present disclosure will be described with respect to the organic light emitting display device 100. However, it should be appreciated that as long as a transistor is included, aspects described herein may be applicable to various organic light emitting display devices, such as the lighting device, the light emitting device, and the like, as well as the organic light-emitting display device 100.

The organic light emitting display device 100 according to aspects described herein includes an organic light emitting display panel PNL that displays an image or outputs light, and a driving circuit for driving the organic light emitting display panel PNL.

The organic light emitting display device 100 according to aspects described herein may be based on a bottom emission type in which light is emitted from an organic light emitting element toward a substrate over which the organic light emitting element is disposed; however, aspects of the present disclosure are not limited thereto. In some aspects, the organic light emitting display device 100 according to aspects described herein may be based on a top emission type in which light is emitted from an organic light emitting element toward a surface opposite to the substrate on which the organic light emitting element is disposed, or based on a double-side emission type in which light is emitted from the organic light emitting element toward both the substrate and the surface opposite to the substrate.

The organic light emitting display panel PNL may include a plurality of data lines DL and a plurality of gate lines GL, and a plurality of sub-pixels SP defined by the plurality of data lines DL and the plurality of gate lines GL, and arranged in a matrix pattern.

The plurality of data lines DL and the plurality of gate lines GL may be arranged to intersect each other in the organic light emitting display panel PNL. For example, the plurality of gate lines GL may be arranged in rows or columns, and the plurality of data lines DL may be arranged in columns or rows. Hereinafter, for convenience of description and ease of understanding, it is assumed that the plurality of gate lines GL is arranged in rows and the plurality of data lines DL is arranged in columns.

In addition to the plurality of data lines DL and the plurality of gate lines GL, one or more other types of signal lines may be arranged in the organic light emitting display panel PNL according to sub-pixel structures or the like. A driving voltage line, a reference voltage line, or a common voltage line may be further disposed.

Types of signal lines disposed on the organic light emitting display panel PNL may vary depending on sub-pixel structures or the like. Further, all or some of each type of signal lines described herein may include all or at least a part of an electrode to which a signal is applied.

The organic light emitting display panel PNL may include an active area A/A on which images are displayed, and a non-active area N/A that is an outer edge, on which images are not displayed. Here, the non-active area N/A is sometimes referred to as a bezel area.

A plurality of sub-pixels SP for image display is arranged in the active area A/A.

A pad portion including one or more conductive pads may be disposed in the non-active area N/A for an electrically connection with a data driver DDR, and a plurality of data link lines may be disposed in the non-active area N/A for electrically connecting between the pad portion and a plurality of data lines DL. Here, the plurality of data link lines may be parts of the plurality of data lines DL extending up to the non-active area N/A (e.g., from the active area A/A), or may be separate patterns electrically connected to the plurality of data lines DL.

Further, gate driving related lines may be arranged in the non-active area N/A to transmit a voltage (signal) required for gate driving to a gate driver GDR through a pad portion to which the data driver DDR is electrically connected. For example, gate driving related lines may include clock lines for carrying clock signals, gate voltage lines for transmitting gate voltages (VGH, VGL), and gate driving control signal lines for carrying various types of control signals required for generating scan signals. These gate driving related lines may be arranged the non-active area N/A, differently from the gate lines GL disposed in the active area A/A.

The driving circuit may include the data driver DDR driving a plurality of data lines DL, the gate driver GDR driving a plurality of gate lines GL, and a controller CTR for controlling the data driver DDR and the gate driver GDR.

The data driver DDR can drive the plurality of data lines DL by applying data voltages to the plurality of data lines DL.

The gate driver GDR can drive the plurality of gate lines GL by supplying scan signals to the plurality of gate lines GL.

The controller CTR can control driving operations of the data driver DDR and the gate driver GDR by supplying various types of control signals (DCS, GCS) required for the driving operations of the data driver DDR and the gate driver GDR. Further, the controller CTR can supply image data DATA to the data driver DDR.

The controller CTR starts to scan a pixel according to a timing processed in each frame, converts image data inputted from the outside (e.g., a host system, other devices or other image providing sources) to a data signal form adapted to be used in the data driver DDR and then outputs image data DATA resulting from the converting, and thus, enables the data to be written into the pixel at a pre-configured time according to the scanning.

To control the data driver DDR and the gate driver GDR, the controller CTR can receive, from the outside (e.g., the host system, other devices or other image providing sources), timing signals, such as, a vertical synchronization signal Vsync, a horizontal synchronization signal Hsync, an input data enable (Data Enable) signal, a clock signal, and the like. The controller CTR can generate various types of control signals using the received signals and supply such generated signals to the data driver DDR and the gate driver GDR.

For example, to control the gate driver GDR, the controller CTR can output several types of gate control signals GCS including a gate start pulse GSP, a gate shift clock GSC, a gate output enable signal GOE, and the like.

Further, to control the data driver DDR, the controller CTR can output several types of data control signals DCS including a source start pulse SSP, a source sampling clock SSC, a source output enable signal SOE, and the like.

The controller CTR may be a timing controller used in the typical display technology or a control apparatus/device capable of additionally performing other control functionalities in addition to the typical function of the timing controller.

The controller CTR may be implemented as a separate component from the data driver DDR or may be implemented as an integrated circuit in which the data driver DDR is integrated together.

The data driver DDR can drive a plurality of data lines DL by supplying data voltages to the plurality of data lines DL after having received image data from the controller CTR. Here, the data driver DDR is sometimes referred to as a source driving circuit or a source driver.

The data driver DDR can transmit various signals to, or receive various signals from, the controller CTR through various interfaces.

The gate driver GDR can sequentially drive a plurality of gate lines GL by sequentially supplying scan signals to the plurality of gate lines GL. Here, the gate driver GDR is sometimes referred to as a scan driving circuit or a scan driver.

According to the control of the controller CTR, the gate driver GDR can sequentially supply scan signals representing an on-voltage or an off-voltage to the plurality of gate lines GL.

When a specific gate line is asserted by a scan signal from the gate driver GDR, the data driver DDR can convert image data DATA received from the controller CTR into analog data voltages and supply the obtained data voltages to the plurality of data lines DL.

The data driver DDR may be located on, but not limited to, only one side (e.g., an upper side or a lower side) of the display panel PNL, or in some aspects, be located on, but not limited to, two sides (e.g., the upper side and the lower side)

of the display panel PNL according to driving schemes, design schemes of display panels, or the like.

The gate driver GDR may be located on, but not limited to, only one side (e.g., a left side or a right side) of the panel PNL, or in some aspects, be located on, but not limited to, two sides (e.g., the left side and the right side) of the display panel PNL according to driving schemes, design schemes of display panels, or the like.

The data driver DDR may be implemented by including one or more source driver integrated circuits SDIC.

Each source driver integrated circuit SDIC may include a shift register, a latch circuit, a digital-to-analog converter DAC, an output buffer, and the like. In some aspects, the data driver DDR may further include one or more analog-to-digital converters ADC.

Each source driver integrated circuit SDIC may be connected to a conductive pad such as a bonding pad of the organic light emitting display panel PNL in a tape automated bonding (TAB) type or a chip on glass (COG) type, or be directly disposed on the display panel 110. In some aspects, each source driver integrated circuit SDIC may be integrated into the organic light emitting display panel PNL. In some aspects, each source driver integrated circuit SDIC may be implemented in a chip on film (COF) type. In this instance, each source driver integrated circuit SDIC may be mounted on a circuit film, and electrically connected to data lines DL in the organic light emitting display panel PNL through the circuit film.

The gate driver GDR may include a plurality of gate driving circuits GDC. The plurality of gate driving circuits GDC may correspond to a plurality of gate lines GL, respectively.

Each gate driving circuit GDC may include a shift register, a level shifter, and the like.

Each gate driving circuit GDC may be connected to a conductive pad such as a bonding pad of the organic light emitting display panel PNL in the tape automated bonding (TAB) type or the chip on glass (COG) type. In some aspects, each gate driving circuit GDC may be implemented in the chip on film (COF) type. In this instance, each gate driving circuit GDC may be mounted on a circuit film, and electrically connected to gate lines GL in the organic light emitting display panel PNL through the circuit film. Further, each gate driving circuit GDC may be implemented in a gate in panel (GIP) type and may be embedded in the organic light emitting display panel PNL. That is, each gate driving circuit GDC may be directly formed in the organic light emitting display panel PNL.

Figure 2:
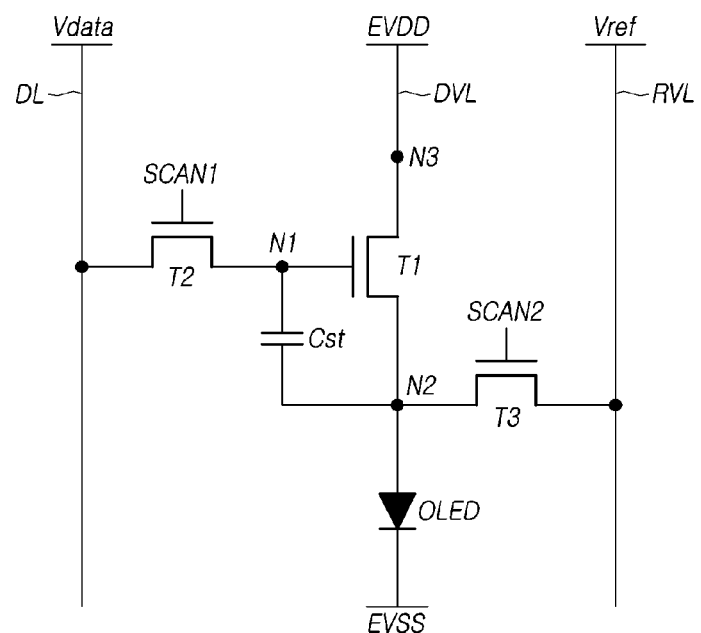
FIG. 2 illustrates a sub-pixel structure when an organic light emitting display panel including organic light emitting diode (OLED) is employed in the display device according to aspects of the present disclosure.

FIG. 2 illustrates a sub-pixel SP structure when an organic light emitting display panel PNL including an organic light emitting element such as an organic light emitting diodes (OLED) is employed in the display device according to aspects of the present disclosure.

Referring to FIG. 2, each sub-pixel SP in the organic light emitting display panel PNL including the organic light emitting element may include a second transistor T2 passing a data voltage Vdata to a first node N1 corresponding to a gate node of a driving transistor T1, and a storage capacitor Cst for maintaining the data voltage Vdata corresponding to an image signal voltage or a voltage corresponding to this during one frame time.

The organic light emitting element OLED may include a first electrode (an anode electrode or a cathode electrode), an organic layer including at least one emission layer, and a second electrode (the cathode electrode or the anode electrode).

In one aspect, a base voltage EVSS such as a low-level voltage may be applied to the second electrode of the organic light emitting element OLED.

The driving transistor T1 can drive the organic light emitting diode OLED by supplying a driving current to the organic light emitting diode OLED.

The driving transistor T1 may have the first node N1, a second node N2, and a third node N3.

The "node" of the first to third nodes N1, N2, and N3 may denote a point, one or more electrodes, or one or more lines, which have an equal electrical state.

Each of the first node N1, the second node N2, and the third node N3 may be made up of one or more electrodes.

The first node N1 of the driving transistor T1 may be a node corresponding to the gate node thereof, and may be electrically connected to a source node or a drain node of the second transistor T2.

The second node N2 of the driving transistor T1 may be electrically connected to the first electrode 301 of the organic light emitting element OLED and may be a source node or a drain node.

The third node N3 of the driving transistor T1 may be the drain node or the source node as a node to which a driving voltage EVDD is applied, and may be electrically connected to a driving voltage line DVL for passing the driving voltage EVDD.

The driving transistor T1 and the second transistor T2 may be n-type transistors or p-type transistors.

The second transistor T2 may be electrically connected between a data line DL and the first node N1 of the driving transistor T1 and may be controlled by a scan signal SCAN that is delivered through a gate line and applied to the gate node of the driving transistor T1.

The second transistor T2 may be turned on by the scan signal SCAN and apply a data voltage Vdata passed through the data line DL to the first node N1 of the driving transistor T1.

The storage capacitor Cst may be electrically connected between the first node N1 and the second node N2 of the driving transistor T1.

The storage capacitor Cst is an external capacitor intentionally designed to be located outside of the driving transistor T1, other than an internal storage, such as a parasitic capacitor (e.g., a Cgs, a Cgd) that presents between the first node N1 and the second node N2 of the driving transistor T1.

A third transistor T3 may be electrically connected between the second node N2 of the driving transistor T1 and a reference voltage line RVL. On-off operations of the third transistor T3 can be controlled by a second scan signal SCAN2 applied to the gate node of the third transistor T3.

A drain node or a source node of the third transistor T3 may be electrically connected to the reference voltage line RVL, and the source node or the drain node of the third transistor T3 may be electrically connected to the second node N2 of the driving transistor T1.

The third transistor T3, for example, may be turned on in a period in which display driving is performed, and turned on in a period in which sensing driving is performed for sensing a characteristic value of the driving transistor T1 or a characteristic value of the organic light emitting diode (OLED).

The third transistor T3 may be turned on by the second scan signal SCAN2 and pass a reference voltage Vref applied to the reference voltage line RVL to the second node N2 of the driving transistor T1, according to corresponding driving timings (e.g., a display driving timing or an initial timing within a time period for the sensing driving).

The third transistor T3 may be turned on by the second scan signal SCAN2 and pass a voltage at the second node N2 of the driving transistor T1 to the reference voltage line RVL, according to corresponding driving timings (e.g., a sampling timing within the time period for the sensing driving).

In other words, the third transistor T3 can control a voltage status at the second node N2 of the driving transistor T1, or pass the voltage at the second node N2 of the driving transistor T1 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driver DDR.

The sensing data output from the analog-to-digital converter may be used to sense a characteristic value of the driving transistor T1 (e.g., a threshold voltage, mobility, etc.) or a characteristic value of the organic light emitting diode (OLED) (e.g., a threshold voltage, etc.).

Each of the driving transistor T1, the second transistor T2, and the third transistor T3 may be an n-type transistor or a p-type transistor.

Meanwhile, the first scan signal SCAN1 and the second scan signal SCAN2 may be separate gate signals. In this instance, the first scan signal SCAN1 and the second scan signal SCAN2 respectively may be applied to the gate node of the second transistor T2 and the gate node of the third transistor T3 through different gate lines.

In some aspect, the first scan signal SCAN1 and the second scan signal SCAN2 may be the same gate signal. In this instance, the first scan signal SCAN1 and the second scan signal SCAN2 may be commonly applied to the gate node of the second transistor T2 and the gate node of the third transistor T3 through the same gate line.

Figure 3:
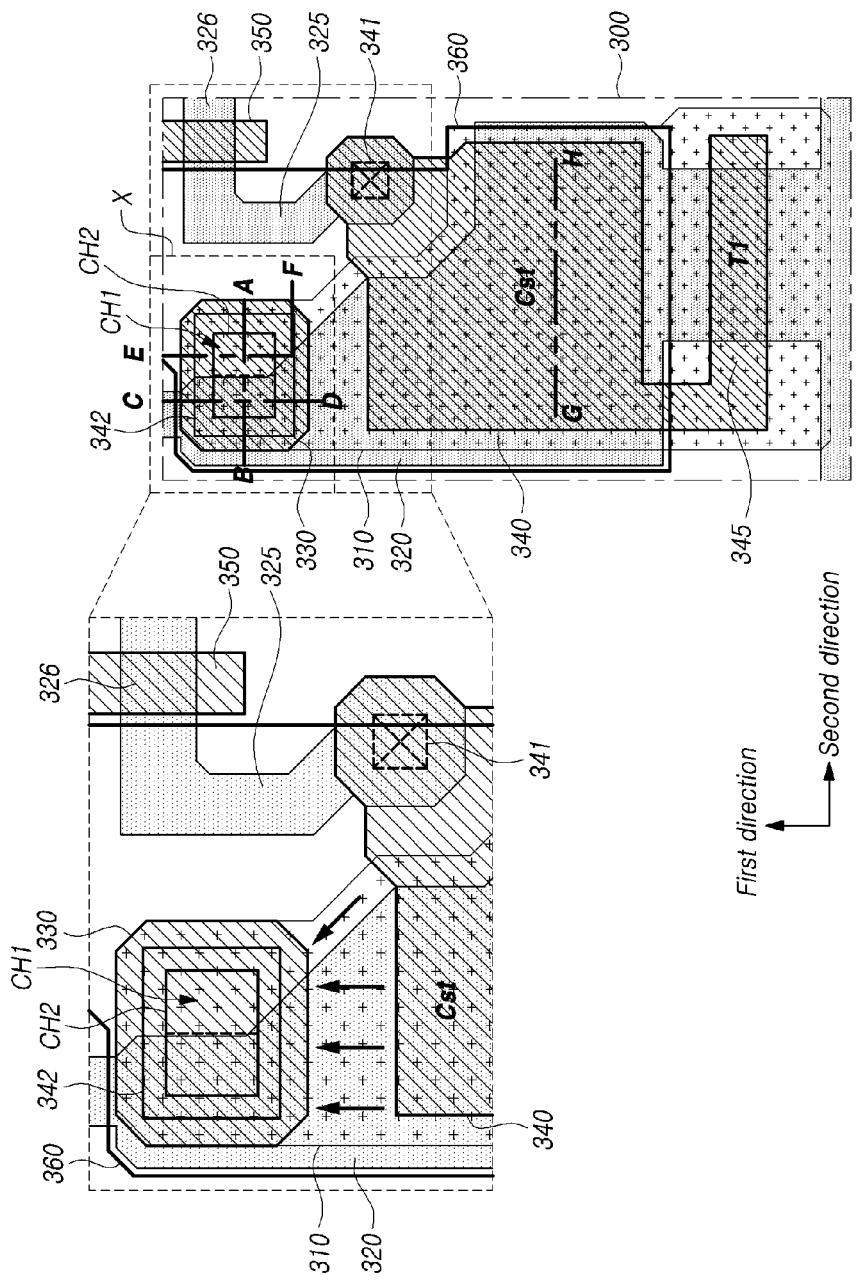
FIG. 3 is a plan view illustrating a partial area of a sub-pixel disposed in an active area of the organic light emitting display device according to aspects of the present disclosure.

It should be understood that the sub-pixel structure with three transistors (3T) and one capacitor (1C) shown in FIG. 3 is merely one example of possible sub-pixel structures for convenience of discussion, and aspects of the present disclosure may be implemented in any of various structures, as desired. For example, the sub-pixel may further include at least one transistor and/or at least one capacitor.

In some aspects, each of a plurality of sub-pixels may have the same structure, or some of the plurality of sub-pixels may have a different structure.

FIG. 3 is a plan view illustrating a partial area of a sub-pixel disposed in an active area of the organic light emitting display device according to aspects of the present disclosure.

Referring to FIG. 3, a first conductive layer 310, a first active layer 320, and a second conductive layer 330, and a plate 340 may be disposed in at least one sub-pixel included in the organic light emitting display device 100 according to aspects described herein.

Further, a second active layer 325 disposed in the same layer as the first active layer 320 may be disposed in the at least one sub-pixel, and a third conductive layer 360 that is an anode electrode (or a cathode electrode) of an organic light emitting element disposed on or over the second conductive layer 330 and the plate 340 may be further disposed in the at least one sub-pixel.

Specifically, the first conductive layer 310 may be disposed on a substrate 300.

The first active layer 320 may be disposed on or over the first conductive layer 310.

Here, a part of the first active layer 320 may overlap a part of the first conductive layer 310.

Further, the second active layer 325 that is disposed in the same layer as the first active layer 320 and spaced apart from the first active layer 320 may be disposed on or over the substrate 300.

The second conductive layer 330 and the plate 340 may be disposed on or over the first active area 320. The second conductive layer 330 and the plate 340 may be spaced apart from each other and disposed in the same layer.

Although not shown in FIG. 3, a buffer layer may be disposed between the first conductive layer 310 and the first active layer 320, and a first insulating film may be disposed between the first active layer 320 and the second conductive layer 330.

The buffer layer may include a first contact hole CH1 in an area corresponding to a part of an area in which the second conductive layer 330 is disposed, and the first insulating film may also include a second contact hole CH2 in an area corresponding to a part of an area in which the second conductive layer 330 is disposed. The first contact hole CH1 may overlap the second contact hole CH2. The first contact hole CH1 may expose a part of the top surface of the first conductive layer 310, and the second contact hole CH2 may expose a part of the top surface of the first conductive layer 310 and a part of the upper surface of the first active layer 320.

The second conductive layer 330 may contact the first conductive layer 310 through the first contact hole CH1 and the second contact hole CH2. The second conductive layer 330 may contact the first active layer 320 through the second contact hole CH2.

Although not shown, the first active layer 320 may be electrically connected to the reference voltage line shown in FIG. 2.

The plate 340 disposed on the first active layer 320 may be spaced apart from the second conductive layer 330.

A part of the plate 340 may overlap a part of the first active layer 320 and a part of the first conductive layer 310.

Each of the first conductive layer 310, the first active layer 320, and the plate 340 may serve as an electrode of the storage capacitor Cst. The part of the first active layer 320 overlapping the plate 340 and the first conductive layer 310 may be a conductive area or an area in which a conductive pattern is disposed.

The plate 340 may include at least one extension portion 345 protruding from one side of the plate 340.

A part of the extension portion 345 may overlap a part of the first active layer 320. The extension portion 345 may be the gate electrode (first gate electrode) of the driving transistor T1 shown in FIG. 2. The first active layer 320 may serve as an active layer of the driving transistor T1.

A second gate electrode 350 may be disposed on the substrate 300. The second gate electrode 350 may be disposed in the same layer as the second conductive layer 330 and the plate 340, and may be spaced apart from the second conductive layer 330 and the plate 340.

The second gate electrode 350 may be the gate electrode of the second transistor T2 of FIG. 2. The second active layer 325 may be an active layer of the second transistor T2.

Although not shown, the second gate electrode 350 may be electrically connected to a data line disposed over the substrate 300. On or over the substrate 300, a plurality of data lines may be disposed in a first direction, and a plurality of gate lines (or scan lines) may be disposed in a second direction crossing the first direction; however, aspects of the present disclosure are not limited thereto. A plurality of signal lines may be arranged in various directions.

A part of the second active layer 325 may be electrically connected to a part of the plate 340 through a contact hole 341.

A point where the second active layer 325 and the plate 340 are electrically connected may correspond to the first node of FIG. 2.

In FIG. 3, the contact hole 341 to which the second active layer 325 and the plate 340 are electrically connected is disposed in an area between the second conductive layer 330 and the extension portion 345; however, aspects of the present disclosure are not limited thereto.

For example, the contact hole 341 to which the second active layer 325 and the plate 340 are electrically connected may be disposed between the second conductive layer 330 and the second gate electrode 350. In one aspect, the contact hole 341 to which the second active layer 325 and the plate 340 are electrically connected may be disposed in parallel with the second conductive layer 330 and the second gate electrode 350.

The third conductive layer 360 may be disposed on or over the second conductive layer 330, the plate 340, and the second gate electrode 350.

The third conductive layer 360 may be an anode electrode or a cathode electrode of an organic light emitting element.

The third conductive layer 360 may contact a part of the top surface of the second conductive layer 330 through a contact hole 342 formed in at least one insulating film disposed between the second conductive layer 330 and the third conductive layer 360.

That is, the first conductive layer 310, the first active layer 320, the second conductive layer 330, and the third conductive layer 360 may be electrically connected to one another, and a point where the first conductive layer 310, the first active layer 320, the second conductive layer 330, and the third conductive layer 360 are connected may correspond to the second node N2 of FIG. 2.

As described above, the first contact hole CH1 for electrically connecting the first conductive layer 310 and the second conductive layer 330, the second contact hole CH2 for electrically connecting the first active layer 320 and the second conductive layer 330, and the contact holes 342 for electrically connecting the second conductive layer 330 and the third conductive layer 360 may overlap one another.

Specifically, the entire first contact hole CH1 may overlap a part of the second contact hole CH2, and the entire second contact hole CH2 may overlap a part of the contact hole 342.

Each of the first contact hole CH1, the second contact hole CH2, and the contact hole 342 may be disposed in an area between the first active layer 320 and the second active layer 325. In other words, each of the first contact hole CH1, the second contact hole CH2, and the contact hole 342 may include an area that does not overlap the first and second active layers 320 and 325.

When the first contact hole CH1, the second contact hole CH2, and the contact hole 342 do not overlap one another, the corresponding sub-pixel may be required to include an area occupied by the first contact hole CH1, an area occupied by the contact hole CH2, and an area occupied by the contact hole 342.

In contrast, in the organic light emitting display device 100 according to aspects described herein, as two or more of the first contact hole CH1, the second contact hole CH2, and the contact holes 342 of at least one insulating layer disposed between the second conductive layer 330 and the third conductive layer 360 overlap each other or one another, thereby an area occupied by the point corresponding to the second node N2 of FIG. 2 can be reduced.

In this manner, since the area of the point corresponding to the second node N2 of the driving transistor T1 of FIG. 2 is reduced, a size of a corresponding non-light emitting area within the sub-pixel can be reduced, and a size of a corresponding light emitting area can be increased. Further, since the area of the point corresponding to the second node N2 of the driving transistor T1 of FIG. 2 is reduced, an area of the electrodes of an associated storage capacitor Cst can be increased without reducing the area of the light emitting area of the organic light emitting display device 100, and thereby, the capacity of the storage capacitor Cst can be increased.

For example, in a case where the organic light emitting display device 100 is required to have high luminance, the area of the corresponding light emitting area is needed to be increased, in the organic light emitting display device 100 according to aspects described herein, as a size of the conductive layer 330 is reduced, the area of the non-light emitting area can be formed to be reduced, and the area of the light emitting area relative to the non-light emitting area can be designed to be increased by the reduced area of the non-light emitting area. Thereby, the organic light emitting display device 100 with high luminance can be implemented.

Specifically, if the size of the second conductive layer 330 disposed in the non-light emitting area is reduced, while maintaining a distance between the second conductive layer 330 and the plate 340 and the capacity of the storage capacitor Cst, a location of the plate 340 may be arranged to be away from the light emitting area (closer to the second conductive layer 330). Thus, the area of the non-light emitting area can be reduced, and the area of the light emitting area can be increased by the reduced area of the non-light emitting area.

Further, in a situation where the organic light emitting display device 100 is required to have high resolution, a high-capacity storage capacitor Cst is needed, and to implement such a high-capacity storage capacitor Cst, it is required to increase an area of the electrodes of the storage capacitor Cst disposed in the sub-pixel.

An area of each sub-pixel is limited, and if the area of the electrodes of the storage capacitor (Cst) is increased, an area of a corresponding light-emitting area included in the sub-pixel may be decreased. This can lead the luminance of the sub-pixel to reduce, and after-images to occur when the associated panel is driven.

In the organic light emitting display device 100 according to aspects described herein, as two or more of the first contact hole CH1, the second contact hole CH2, and the contact hole 342 overlap each other or one another, the area of the electrodes of the storage capacitor Cst can be increased by an area corresponding to the reduction of the area occupied by the point corresponding to the second node N2 of the driving transistor T1. In other words, as the area of the electrodes of the storage capacitor Cst can be increased without reducing the area of the light emitting area, the capacity of the storage capacitor Cst can be increased, and it is therefore possible to implement the organic light emitting display device 100 having high luminance and high resolution characteristics and preventing after-images.

Next, structures for an area included in a second node N2 of a driving transistor T1 in at least one sub-pixel of the organic light emitting display device 100 according to aspects described herein will be described with reference to the drawings.

Figure 4:
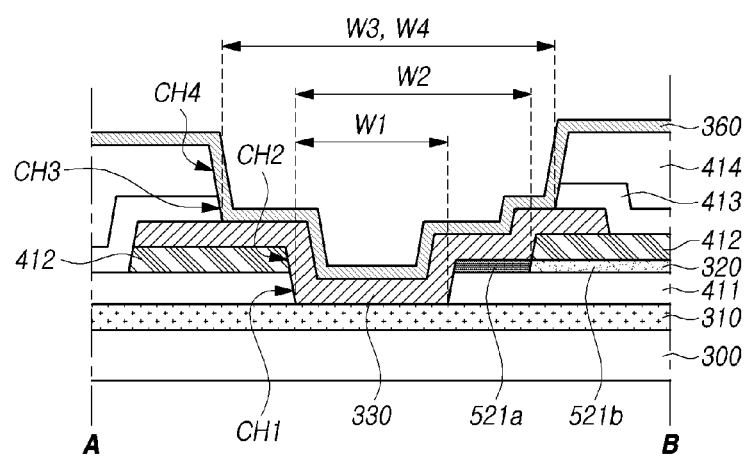
FIG. 4 is a cross-sectional view taken along with line A-B of FIG. 3 in one aspect according to aspects of the present disclosure.

FIG. 4 is a cross-sectional view taken along with line A-B of FIG. 3 in one aspect according to aspects of the present disclosure.

As described above, an area shown in FIG. 4 may be an area including an area corresponding to the second node N2 of the driving transistor T1 of FIG. 2.

Referring to FIG. 4, the first conductive layer 310 may be disposed on the substrate 300.

The first conductive layer 310 may include a conductive material capable of absorbing or reflecting light. For example, the first conductive layer 310 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto.

The first conductive layer 310 may be disposed under the first active layer 320, and serve to protect the first active layer 320 from external factors (e.g., light) or serve as an electrode of the storage capacitor Cst.

In FIG. 4, the first conductive layer 310 is illustrated as a single layer structure; however, aspects of the present disclosure are not limited thereto. For example, the first conductive layer 310 may have a multilayer structure.

A buffer layer 411 may be disposed over the substrate on which the first conductive layer 310 is disposed.

The buffer layer 411 may include an inorganic insulating material such as silicon oxide (SiOx), silicon nitride (SiNx), or silicon oxynitride (SiON); however, aspects of the present disclosure are not limited thereto.

In FIG. 4, the buffer layer 411 is represented as a single layer structure; however, aspects of the present disclosure are not limited thereto. For example, the buffer layer 411 may have a multilayer structure.

The buffer layer 411 may include the first contact hole CH1 exposing a part of the top surface of the first conductive layer 310.

The first active layer 320 may be disposed on a part of the top surface of the buffer layer 411.

As illustrated in FIG. 4, the first active layer 320 disposed in the sub-pixel of the organic light emitting display device 100 according to aspects described herein may have a single layer.

The first active layer 320 may be various types of semiconductor layers.

The first active layer 320 may be formed of an oxide semiconductor. An material included in the first active layer 320 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the first active layer 320 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, aspects of the present disclosure are not limited thereto.

The first active layer 320 may include a conductive area and a non-conductive area. Further, a first insulating film 412 may be disposed on the non-conductive area of the first active layer 320, and the conductive area of the first active layer 320 may be an area not overlapping the first insulating film 412.

The first insulating film 412 may be disposed on the first active layer 320.

The first insulating film 412 may include an inorganic insulating material such as silicon oxide (SiOx), silicon nitride (SiNx), or silicon oxynitride (SiON); however, aspects of the present disclosure are not limited thereto.

The first insulating film 412 may include the second contact hole CH2 overlapping the first contact hole CH1 provided in the buffer layer 411.

Accordingly, the first insulating film 412 may also expose a part of the top surface of the first conductive layer 310 through the second contact hole CH2.

A width W1 of the first contact hole CH1 may be smaller than a width W2 of the second contact hole CH2. Here, the width W1 of the first contact hole CH1 and the width W2 of the second contact hole CH2 may be maximum lengths of respective contact holes in the cutting direction along line A-B shown in FIG. 3. The cutting direction along line A-B shown in FIG. 3 may be a second direction of FIG. 3 (e.g., a direction in which the gate line GL shown in FIG. 1 runs).

The first contact hole CH1 of the buffer layer 411 and the second contact hole CH2 of the first insulating film 412 may be formed through the same process. Through this, there is provided an advantage of reducing the number of masks required to form the buffer layer 411 and the first insulating film 412.

Specifically, a material of the buffer layer 411 may be deposited on the substrate 300, and a material of the first active layer 320 may be deposited on the buffer layer 411. After patterning the material of the first active layer 320, a material of the first insulating film 412 may be deposited over the substrate 300.

Thereafter, a process of forming a contact hole in each of the first insulating film 412 and the buffer layer 411 may be performed through a dry etching process. In this situation, in an area which the material of the first active layer 320 on the buffer layer 411 is present, as the material of the first active layer 320 serves as a mask, as a result, the contact hole of the buffer layer 411 may not be formed in the corresponding area.

That is, as shown in FIG. 4, even when the respective contact holes are formed in the first insulating film 412 and the buffer layer 411 through the same process, since the first contact hole of the buffer layer 411 is not formed in the area where the first active layer 320 is present, and the material of the first active layer 320 serving as a mask is not present on the insulating film 412, a width W1 of the first contact hole CH1 of the buffer layer 411 may be smaller than a width W1 of the second contact hole CH2 of the first insulating film 412.

The first insulating film 412 may expose a part of the top surface of the first active layer 320 disposed on the buffer layer 411 through the second contact hole CH2. An area of the first active layer 320 not overlapping the first insulating film 412 may be a conductive area.

As described above, the material of the first insulating film 412 may be patterned through the dry etching process using plasma to form the first insulating film 412 having the second contact hole CH2. Further, the first active layer 320 disposed in an area corresponding to an area in which the material of the first insulating film 412 is removed through the dry etching may become conductive (i.e. modified to act as a conductor) due to plasma.

However, aspects of the present disclosure are not limited thereto, and a part of the conductive area of the first active layer 320 may overlap a part of the first insulating film 412 according to dry etching process conditions.

The second conductive layer 330 may be disposed over the substrate 300 over which the first insulating film 412 is disposed.

The second conductive layer 330 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto.

The second conductive layer 330 may contact the top surface of the first conductive layer 310 exposed through the first contact hole CH1 of the buffer layer 411 and the second contact hole CH2 of the first insulating film 412.

Further, the second conductive layer 330 may be disposed over the buffer layer 411 and contact the conductive area of the first active layer 320 disposed around the first contact hole CH1 of the buffer layer 411.

In other words, the second conductive layer 330 may be electrically connected to the first conductive layer 310 and may be electrically connected to the first active layer 320 as well.

A second insulating film 413 may be disposed on the second conductive layer 330.

The second insulating film 413 may include an inorganic insulating material such as silicon oxide (SiOx), silicon nitride (SiNx), or silicon oxynitride (SiON); however, aspects of the present disclosure are not limited thereto.

The second insulating film 413 may include a third contact hole CH3 exposing a part of the top surface of the second conductive layer 330. The third contact hole CH3 of the second insulating film 413 may overlap at least a part of the first contact hole CH1 formed in the buffer layer 411, and overlap at least a part of the second contact hole CH2 formed in the first insulating film 412.

A third insulating film 414 may be disposed on the second insulating film 413.

The third insulating film 414 may include an organic insulating material; however, aspects of the present disclosure are not limited thereto.

The third insulating film 414 may include a fourth contact hole CH4 overlapping the third contact hole CH3 of the second insulating film 413.

Accordingly, the third insulating film 414 may expose a part of the top surface of the second conductive layer 330 through the fourth contact hole CH4.

The third conductive layer 360 may be disposed on the third insulating film 414.

The third conductive layer 360 may include a transparent conductive material, for example, at least one of Indium Tin Oxide (ITO), Indium Zinc Oxide (IZO), or Indium Gallium Zinc Oxide (IGZO); however, aspects of the present disclosure are not limited thereto.

The third conductive layer 360 may contact the second conductive layer 330 through the third contact hole CH3 of the second insulating film 413 and the fourth contact hole CH4 of the third insulating film 414.

Accordingly, the third conductive layer 360 may be electrically connected to the second conductive layer 330 electrically connected to the first conductive layer 310 and the first active layer 320.

Meanwhile, a width W3 of the third contact hole CH3 of the second insulating film 413 may be substantially the same as a width W4 of the fourth contact hole CH4 of the third insulating film 414. The width W3 of the third contact hole CH3 of the second insulating film 413 and the width W4 of the fourth contact hole CH4 of the third insulating film 414 may be maximum lengths of respective contact holes in the cutting direction of line A-B shown in FIG. 3.

However, aspects of the present disclosure are not limited thereto. For example, in the cutting direction of line A-B shown in FIG. 3, the width W3 of the third contact hole CH3 of the second insulating film 413 may be smaller than the width W4 of the fourth contact hole CH4 of the third insulating film 414.

As described above, in an area included in the second node N2 of the driving transistor T1 of the organic light emitting display device 100 according to aspects described herein, the first contact hole CH1 of the buffer layer 411, the second contact hole CH2 of the first insulating film 412, the third contact hole CH3 of the second insulating film 413, and the fourth contact holes CH4 of third insulating film 414 may overlap one another.

Further, the first conductive layer 310, the first active layer 320, the second conductive layer 330, and the third conductive layer 340 are electrically connected to one another through the respective contact holes (CH1, CH2, CH3, and CH4).

Although FIG. 4 illustrates that the first active layer 320 has a single layer structure; however, aspects of the present disclosure are not limited thereto.

For example, the first active layer 320 may have a multilayer structure of two or more layers. The configuration is discussed in detail with reference to FIG. 5.

Figure 5:
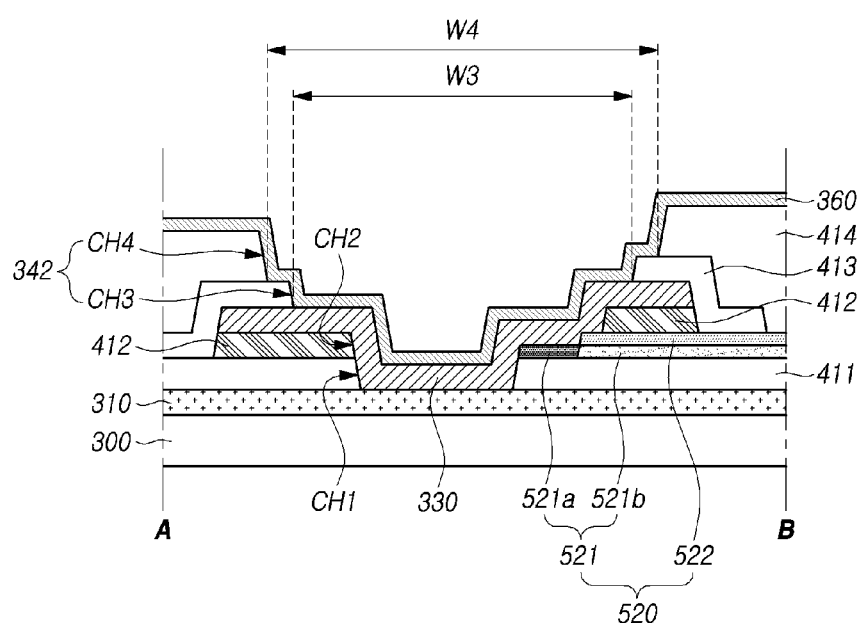
FIG. 5 is a cross-sectional view illustrating an area taken along with line A-B of FIG. 3 in another aspect according to aspects of the present disclosure.

FIG. 5 is a cross-sectional view illustrating an area taken along with line A-B of FIG. 3 in another aspect according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

As shown in FIG. 5, the organic light emitting display device 100 according to aspects described herein includes the first conductive layer 310, the buffer layer 411 including the first contact hole CH1, and an active layer 520, the first insulating film 412 including the second contact hole CH2, the second conductive layer 330, the second insulating film 413 including the third contact hole CH3, and the third insulating film 414 including the fourth contact hole CH4, and the third conductive layer 360.

A first active layer 520 disposed on the buffer layer 411 may include an active pattern 521 and at least one conductive pattern 522 disposed on the active pattern 521. The conductive pattern 522 may be disposed to expose a part of the top surface, and at least one side, of the active pattern 521; however, structures of the first active layer 520 according to aspects described herein are not limited thereto.

The active pattern 521 may be formed of an oxide semiconductor. An material included in the first active layer 520 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the active pattern 521 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, aspects of the present disclosure are not limited thereto.

The conductive pattern 522 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, aspects of the present disclosure are not limited thereto. For example, the conductive pattern 622 may include an alloy of molybdenum (Mo) and titanium (Ti); however, aspects of the present disclosure are not limited thereto.

The conductive pattern 522 may be disposed on the active pattern 521 to help electrical connection with other components. Further, the conductive pattern 522 may serve as a mask in a conductive process of the active pattern 521, thus serving to help the conductive process of the active pattern 521 without an additional mask.

The first insulating film 412 may be disposed to expose a part of the top surface, and at least one side surface, of the active pattern 521. The first insulating film 412 may be disposed to expose a part of the top surface, and at least one side surface, of the conductive pattern 522.

The active pattern 521 may include a conductive area 521a and a non-conductive area 521b.

The conductive area 521a of the active pattern 521 may not overlap the first insulating film 412, and include an area not overlapping the conductive pattern 522. In this aspect, the non-conductive area 521b of the active pattern 521 may be an area overlapping the conductive pattern 522.

In another aspect, the conductive area 521a of the active pattern 521 may not overlap the first insulating film 412 and include a part of an area overlapping the conductive pattern 522. In this aspect, the non-conductive area 521b of the active pattern 521 may overlap the first insulating film 412 and correspond to an area overlapping a part of the conductive pattern 522.

In another aspect, a part of the conductive area 521a of the active pattern 521 may overlap the first insulating film 412 and the conductive pattern 522. In this aspect, the non-conductive area 521b of the active pattern 521 may overlap a part of the first insulating film 412.

The conductive area 521a of the active pattern 521 may be formed through the dry etching process for the first insulating film 412. In this situation, the conductive pattern 522 disposed on the active pattern 521 serves as a mask, thus, an area of the active pattern 521 not overlapping the conductive pattern 522 can become conductive (i.e. modified to act as a conductor) by plasma.

Further, depending on the dry etching process conditions, the conductive area 521a of the active pattern 521 may be extended up to a part of an area overlapping the conductive pattern 522.

The extension portion of the conductive area 521a of the active pattern 521 may contact the conductive pattern 522. For example, as shown in FIG. 5, when one end of the conductive pattern 522 is located at a boundary between the conductive area 521a and the non-conductive area 521b of the active pattern 521, the conductive pattern 522 may contact at least a part of the conductive area 521a of the active pattern 521 at the boundary between the conductive area 521a and the non-conductive area 521b of the active pattern 521.

Further, when a part of the conductive area 521a of the active pattern 521 overlaps a part of the conductive pattern 522, the conductive pattern 522 may contact a part of the top surface of the conductive area 521a of the active pattern 521.

A second conductive layer 330 may be disposed over the substrate 300 over which the first insulating film 412 is disposed.

In an area resulting from cutting along line A-B of FIG. 3, a part of the second conductive layer 330 may overlap a part of the first active layer 520, and the remaining part of the second conductive layer 330 may not overlap the first active layer 520.

The second conductive layer 330 may contact a part of the active pattern 521 and a part of the conductive pattern 522 of the first active layer 520 through the second contact hole CH2 formed in the first insulating film 412. Specifically, the second conductive layer 330 may contact a part of the top surface, and at least one side surface, of the conductive pattern 522 not overlapping the first insulating film 412. Further, the second conductive layer 330 may contact a part of the top surface, and at least one side surface, of the active pattern 521 (i.e. the conductive area 521a of the active pattern 521) that does not overlap the conductive pattern 522.

The second conductive layer 330 may contact the first conductive layer 310 through the second contact hole CH2 formed in the first insulating film 412 and the first contact hole CH1 formed in the buffer layer 411.

Accordingly, the second conductive layer 330 may be electrically connected to the first conductive layer 310, and the active pattern 521 and the conductive pattern 522 of the first active layer 520.

According to aspects described herein, the resistance of the conductive pattern 522 may be lower than that of the active pattern 521. In this manner, as the conductive pattern 522 is disposed on the active pattern 521, and the second conductive layer 330 is electrically connected to the conductive pattern 522 of the first active layer 520, there is provided an advantage of reducing contact resistance.

The second insulating film 413 having the third contact hole CH3 and the third insulating film 414 having the fourth contact hole CH4 may be disposed on or over the second conductive layer 330.

In the cutting direction of line A-B shown in FIG. 3, the width W3 of the third contact hole CH3 of the second insulating film 413 may be smaller than the width W4 of the fourth contact hole CH4 of the third insulating film 414.

Further, the third conductive layer 360 may be disposed over the substrate over which the third insulating film 414 is disposed. The third conductive layer 360 may be electrically connected to the second conductive layer 330 through the third contact hole CH3 and the fourth contact hole CH4.

FIGS. 4 and 5 illustrate a structure in which one edge of the active layer (320, 520) overlaps one edge of the buffer layer 411, but structures of the organic light emitting display device 100 according to aspects described herein are not limited thereto.

Hereinafter, discussions will be given in detail on a further structure of the organic light emitting display device 100 according to aspects of the present disclosure.

Figure 6:
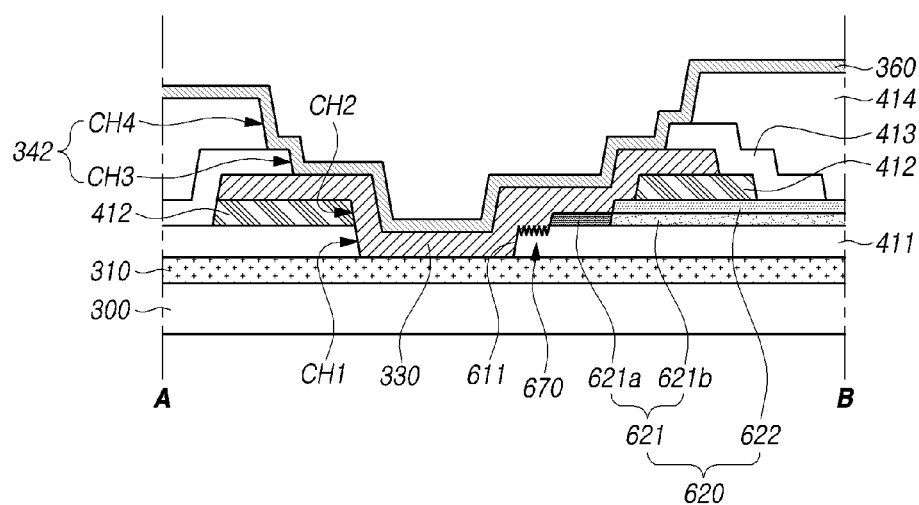
FIG. 6 is a cross-sectional view illustrating an area taken along with line A-B of FIG. 3 in further another aspect according to aspects of the present disclosure.

FIG. 6 is a cross-sectional view illustrating an area taken along with line A-B of FIG. 3 in further another aspect according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 6, a first active layer 620 may be disposed on a part of the top surface of the buffer layer 411.

Specifically, an active pattern 621 of the first active layer 620 may be disposed on a part of the top surface of the buffer layer 411, and a conductive pattern 622 of the first active layer 620 may be disposed on the active pattern 621. The active pattern 621 may include a conductive area 621a and a non-conductive area 621b.

The active pattern 621 and the conductive pattern 622 may be disposed to expose a part of the top surface of the buffer layer 411. The conductive pattern 622 may be disposed to expose a part of the top surface, and at least one side surface, of the active pattern 621.

The buffer layer 411 may include the first contact hole CH1 exposing a part of the top surface of the first conductive layer 310. A part of the top surface of an extension portion extending from one side surface 611 of the buffer layer 411 formed by the first contact hole CH1 may not overlap the active pattern 621 and the conductive pattern 622 of the first active layer 620, and may not also overlap the first insulating film 412 disposed on the first active layer 620.

A plurality of protrusions 670 may be disposed in at least a part of the top surface of the extension portion not overlapping the first active layer 620 and the first insulating film 412 and extending from one side surface 611 of the buffer layer 411 formed by the first contact hole CH1.

The shape of the plurality of protrusions 670 may be irregular; however, aspects of the present disclosure are not limited thereto.

The plurality of protrusions 670 may be formed through the dry etching process for forming the second contact hole CH2 of the first insulating film 412.

Specifically, before the first insulating film 412 is formed, a material of the active pattern 621 and a material of the conductive pattern 622 may be sequentially deposited on a material of the buffer layer 411 in which the first contact hole CH1 is not formed.

Further, after patterning the conductive pattern 622 using wet etching, the first active layer 620 including the active pattern 621 remaining in a non-conductive state may be formed through the process of patterning the material of the active pattern 621 using wet etching.

In this situation, as the conductive pattern 622 is disposed on the active pattern 621, this serves to prevent the active pattern 621 from being completely removed by an etching solution in the process of patterning the material of the active pattern 621, and enables the material forming the active pattern 621 to be patterned, thereby enabling the active pattern 621 to be formed under the conductive pattern 622. That is, the process stability of the first active layer 620 may be improved by the conductive pattern 622.

As described above, when patterning the active pattern 621 using wet etching, an outer edge of the active pattern 621 may have a very thin thickness due to the influence of the etching solution.

Thereafter, after depositing the material of the first insulating film 412 on the first active layer 620 including the active pattern 621 remaining in the non-conductive state and the conductive pattern 622, the first and second contact holes CH1 and CH2 may be formed substantially simultaneously by performing dry etching for the material of the first insulating film 412 and the material of the buffer layer 411.

The first contact hole CH1 of the buffer layer 411 may be formed as the material of the buffer layer 411 locating in an area corresponding to an area in which the active pattern 621 is not disposed is removed in the dry etching process for removing the material of the first insulating film 412.

In addition, the outer edge of the active pattern 621 (having the thin thickness) may be removed by plasma to expose a part of the top surface of the buffer layer 411. Accordingly, the plurality of protrusions 670 may be formed on at least a part of the top surface of the buffer layer 411 adjacent to the first contact hole CH1 by plasma.

As described above, in the process of forming the second contact hole CH2 in the material of the first insulating film 412 and the first contact hole CH1 in the material of the buffer layer 411, the area of the active pattern 621 with the thin thickness (the outer edge of the active pattern) may be removed, and the area that is not removed and exposed by the plasma may become conductive (i.e. modified to act as a conductor) and therefore become the conductive area 621a of the active pattern 621.

However, aspects of the present disclosure are not limited thereto, depending on the process conditions, a part of the conductive area 621a of the active pattern 621 may overlap a part of the conductive pattern 622 and may overlap a part of the first insulating film 412.

The conductive area 621a of the active pattern 621 may be electrically connected to a part of the conductive pattern 622.

The second conductive layer 330 may be disposed on or over the buffer layer 411, the first active layer 620, and the first insulating film 412.

The second conductive layer 330 may contact a part of the top surface, and at least one side surface, of the conductive pattern 622 of the first active layer 620 through the second contact hole CH2 formed in the first insulating film 412. The second conductive layer 330 may contact a part of the top surface, and at least one side surface, of the conductive pattern 621a of the active pattern 621 of the first active layer 620 through the second contact hole CH2 provided in the first insulating film 412.

The second conductive layer 330 may contact the surfaces of all or some of the plurality of protrusions 670 disposed on at least a part of the top surface of the buffer layer 411.

The second insulating film 413 having the third contact hole CH3 and the third insulating film 414 having the fourth contact hole CH4 may be disposed on or over the second conductive layer 330.

The third contact hole CH3 and the fourth contact hole CH4 may be disposed to overlap the plurality of protrusions 670 of the buffer layer 411.

Further, the third conductive layer 360 may be disposed over the substrate over which the third insulating film 414 is disposed. The third conductive layer 360 may be electrically connected to the second conductive layer 330 through the third contact hole CH3 and the fourth contact hole CH4. The third conductive layer 360 may contact the second conductive layer 330 even in an area in which the plurality of protrusions 670 are disposed in at least a part of the top surface of the buffer layer 411.

Meanwhile, in the area corresponding to the second node N2 of the driving transistor T1 of FIG. 2, structures in which the buffer layer 411, the first active layer (320, 520, or 620), the first insulating film 412, and the second conductive layer 330 of the organic light emitting display device 100 according to aspects described herein are disposed are not limited to structures illustrated in FIGS. 4 to 6; thus, may be variously formed.

Hereinafter, with reference to FIGS. 7 and 9, discussions will be given on other structures of the organic light emitting display device according to aspects of the present disclosure.

Figure 7:
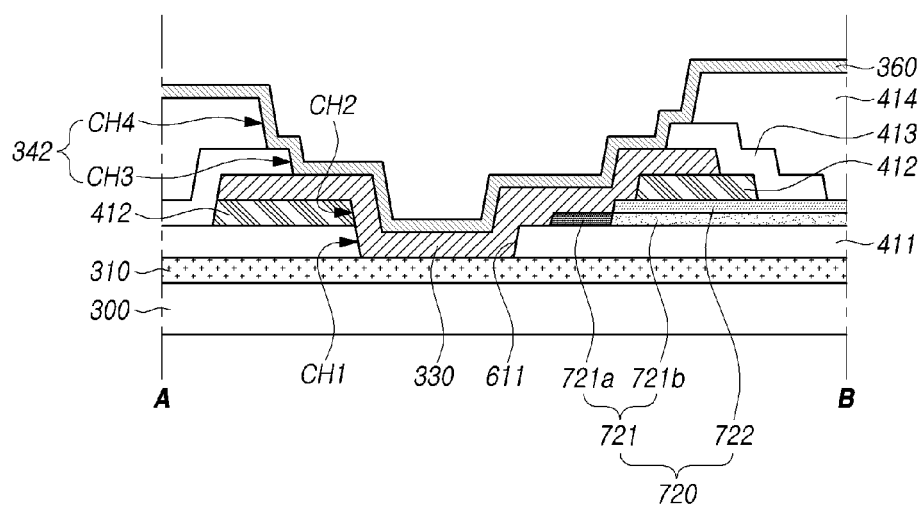
FIGS. 7 to 9 illustrate various aspects for arrangements of a buffer layer, a first active layer, a first insulating film, and a second conductive layer in the organic light emitting display device 100 according to aspects of the present disclosure.
Figure 8:
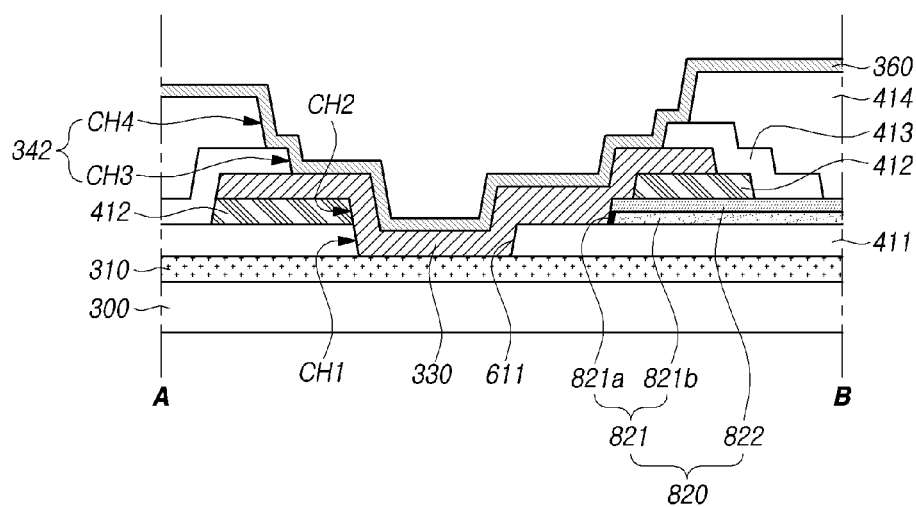
Figure 9:
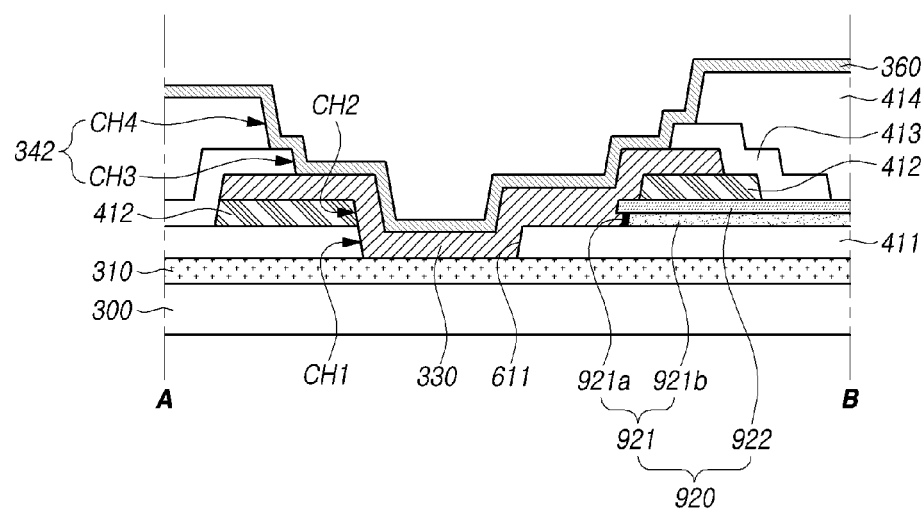

FIGS. 7 to 9 illustrate various aspects for arrangements of the buffer layer, a first active layer, the first insulating film, and the second conductive layer of the organic light emitting display device according to aspects described herein.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 7, an active pattern 721 of a first active layer 720 may be disposed on a part of the top surface of the buffer layer 411, and a conductive pattern 722 of the first active layer 720 may be disposed on the active pattern 721.

The active pattern 721 may include a conductive area 721a and a non-conductive area 721b. A part of the conductive pattern 722 may contact a part of the conductive area 721a of the active pattern 721.

The active pattern 721 and the conductive pattern 722 may be disposed to expose a part of the top surface of the buffer layer 411. The conductive pattern 722 may be disposed to expose a part of the top surface, and at least one side surface, of the active pattern 721.

The buffer layer 411 may include the first contact hole CH1 exposing a part of the top surface of the first conductive layer 310. A part of the top surface of an extension portion extending from one side surface 611 of the buffer layer 411 formed by the first contact hole CH1 may not overlap the active pattern 721 and the conductive pattern 722 of the first active layer 720, and may not also overlap the first insulating film 412 disposed on the first active layer 720.

The second conductive layer 330 may contact surfaces of the first active layer 720 and the buffer layer 411 not overlapping the first insulating film 412.

The second conductive layer 330 may contact a part of the conductive area 721a of the first active layer 720 and a part of the conductive pattern 722 through the second contact hole CH2 of the first insulating film 412.

The process of forming the first contact hole CH1 of the buffer layer 411 and the second contact hole CH2 of the first insulating film 412 shown in FIG. 7 may be equal to the process described with reference to FIG. 6.

Comparing with the structure of FIG. 6, in the structure of FIG. 7, according to the process conditions of forming the first contact hole CH1 of the buffer layer 411 and the second contact hole CH2 of the first insulating film 412, a protrusion may not be formed in a part of the top surface of the extension portion not overlapping the first active layer 720 and the first insulating film 412 and extending from one side surface 611 of the buffer layer 411.

Further, depending on process conditions, the conductive area 621a of the active pattern 621 may not overlap the conductive pattern 622 and the first insulating film 412, and a part of the non-conductive area 621b of the active pattern 621 may overlap not only a part of the conductive pattern 622, but a part of the first insulating film 412.

The second insulating film 413 including the third contact hole CH3 and the third insulating film 414 including the fourth contact hole CH4 may be disposed on or over the second conductive layer 330. Each of the third contact hole CH3 and the fourth contact hole CH4 may overlap the first contact hole CH1 and the second contact hole CH2.

The third conductive layer 360 may be disposed on the third insulating film 414.

The third conductive layer 360 may be electrically connected to the second conductive layer 330 through the third contact hole CH3 and the fourth contact hole CH4.

Meanwhile, although FIGS. 5 to 7 illustrate structures in which a part of the top surface of the active pattern (521, 621, or 721) of the first active layer (520, 620, or 720) does not overlap the conductive pattern (522, 622, or 722); however, aspects of the present disclosure are not limited thereto.

Referring to FIG. 8, at least one outer edge of an active pattern 821 of a first active layer 820 may overlap an outer edge of conductive pattern 822 thereof.

In this aspect, after depositing a material of the active pattern 821 on a material of the buffer layer 411, and a material of the conductive pattern 822 on the material of the active pattern 821, then the material of the conductive pattern 822 may be patterned by wet etching using a photoresist.

Thereafter, the active pattern 821 and the conductive pattern 822 of the first active layer 820 may be formed as shown in FIG. 8 by patterning through wet etching for the material of the active pattern 821 using the photoresist and the conductive pattern 822. Specifically, one outer edge of the photoresist pattern may overlap one outer edge of the conductive pattern 822, and when wet etching for the material of the active pattern 821 is performed using the photoresist pattern and the conductive pattern 822 as a mask, the outer edge of the conductive pattern 822 and the outer edge of the active pattern 821 may overlap as shown in FIG. 8.

Further, the top surface of the active pattern 821 remaining in a non-conductive state may be covered by the conductive pattern 822, and a side surface of the active pattern 821 may not be covered by the conductive pattern 822 and may exist in an exposed state.

Thereafter, the material of the first insulating film 412 may be formed by removing the photoresist pattern disposed on the conductive pattern 822.

The second contact hole CH2 may be formed in the first insulating film 412 through the dry etching process, and the first contact hole CH1 may be formed in the buffer layer 411. In this process, the side surface of the active pattern 821 that is not covered by the conductive pattern 822 may become conductive by plasma.

By changing conditions such as a dry etching process time and an amount or strength of plasma energy, the inside, such as a side outer edge, of the active pattern 821 may become conductive (i.e. modified to act as a conductor), as well as the surface forming the side surface of the active pattern 821.

The active pattern 821 may include a conductive area 821a and a non-conductive area 821b.

The conductive pattern 822 may overlap at least a part of the conductive area 821a of the active pattern 821. Thus, the conductive area 821a of the active pattern 821 may be electrically connected to a part of the conductive pattern 822.

The first insulating film 412 may be disposed on the first active layer 820, and the second conductive layer 330 may be disposed on the first insulating film 412.

The second conductive layer 330 may contact a part of the top surface, and at least one side surface, of the conductive pattern 822 of the first active layer 820 through the second contact hole CH2 formed in the first insulating film 412.

The second conductive layer 330 may contact the conductive area 821a of the active pattern 821 of the first active layer 820 through the second contact hole CH2 formed in the first insulating film 412.

The second insulating film 413 including the third contact hole CH3 and the third insulating film 414 including the fourth contact hole CH4 may be disposed on the second conductive layer 330.

The third conductive layer 360 may be disposed on the third insulating film 414.

The third conductive layer 360 may be electrically connected to the second conductive layer 330 through the third contact hole CH3 and the fourth contact hole CH4.

However, shapes of the first active layer according to aspects described herein are not limited thereto.

For example, as illustrated in FIG. 9, an active pattern 921 may have a structure exposing a part of the rear surface of a conductive pattern 922.

The first active layer 920 having the structure in which the active pattern 921 exposes the part of the rear surface of the conductive pattern 922 may be formed through the process described in FIG. 8.

Comparing with the structure of FIG. 8, in the structure of FIG. 9, as a material of the active pattern 921 may be over-etched by an etching solution in the process of performing wet etching for the material of the active pattern 921 using a photoresist pattern and the conductive pattern 922, taking account of this situation, a structure is provided in which the active pattern 921 is allowed to expose a part of the rear surface of the conductive pattern 922.

In the dry etching process of forming the second contact hole CH2 in the first insulating layer 412 and forming the first contact hole CH1 in the buffer layer 411, a side outer edge of the active pattern 921 that is not covered by the conductive pattern 922 may become conductive (i.e. modified to act as a conductor) by plasma.

In this situation, the top surface of the active pattern 921 remaining in the non-conductive state may be covered by the conductive pattern 922, and a side surface of the active pattern 921 may not be covered by the conductive pattern 922 and may exist in an exposed state.

Thus, the active pattern 921 may include a conductive area 921a and a non-conductive area 921b. The conductive area 921a of the active pattern 921 may be an area corresponding to the side outer edge of the active pattern 921, and the remaining area may be a non-conductive area 921b.

Meanwhile, a boundary area between the side outer edge and the top surface of the active pattern 921 may also become conductive, and the rear surface of the conductive pattern 922 may contact the boundary area between the side outer edge and the top surface of the active pattern 921.

The first insulating film 412 may be disposed on the first active layer 920, and the second conductive layer 330 may be disposed on the first insulating film 412.

The second conductive layer 330 may contact a part of the top surface, and at least one side surface, of the conductive pattern 922 of the first active layer 920 through the second contact hole CH2 formed in the first insulating film 412. Further, the second conductive layer 330 may also contact at least a part of the rear surface of the conductive pattern 922.

The second conductive layer 330 may contact the side outer edge of the active pattern 921 that is the conductive area 921a of the active pattern 921 of the first active layer 920 through the second contact hole CH2 formed in the first insulating film 412.

That is, even when the active pattern 921 is over-etched by the process of forming the elements disposed over the substrate 300 to expose a part of the rear surface of the conductive pattern 922, as the conductive pattern 922 may contact the side outer edge of the active pattern 921 that is the conductive area 921a of the active pattern 921, and the second conductive layer 330 may contact the first active layer 920, this structure can help to easily drive an associated sub-pixel.

Meanwhile, in FIG. 9, although the structure in which the side outer edge of the active pattern 921 may become conductive, and the side outer edge of the active pattern 921 may correspond to the conductive area 921a have been described; however, aspects of the present disclosure are not limited thereto.

For example, in an area corresponding to the area cut along line A-B of FIG. 3 according to conditions of a process of modifying to act as a conductor (dry etching process) of the active pattern 921, the side outer edge, or one side surface, of the active pattern 921 may not become conductive (i.e., not modified to act as a conductor).

However, the active pattern 921 may become conductive in an area other than the area corresponding to the area cut along line A-B of FIG. 3, and a corresponding conductive area may be electrically connected to, by contacting, the conductive pattern 922.

Further, in FIGS. 3 to 9, although the discussions have been conducted with respect to the structure in which the first insulating film 412 exposes a part of the top surface of the first active layer (320, 520, 620, 720, 820, or 920) through the second contact hole CH2; however, aspects of the present disclosure are not limited thereto.

Discussions will be conducted on an arrangement relationship between a first active layer and a first insulating film in another aspect according to aspects of the present disclosure.

Figure 10:
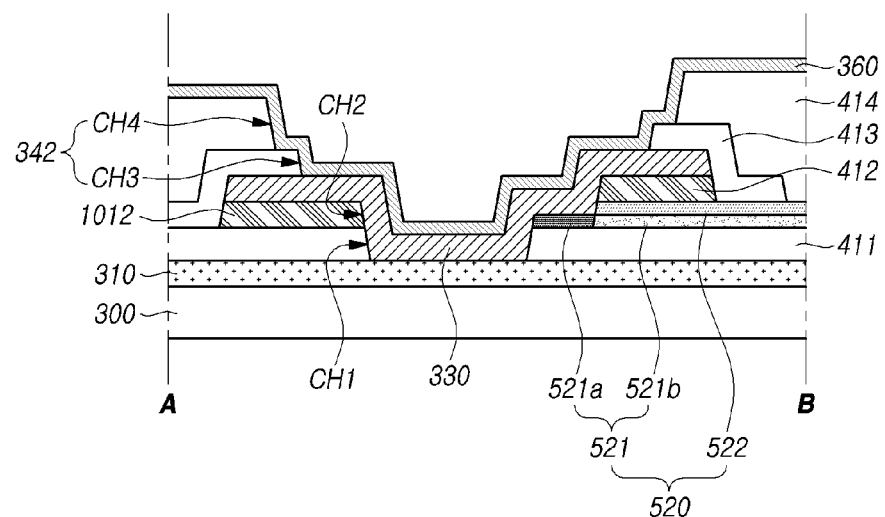
FIG. 10 illustrates an arrangement relationship between a first active layer and a first insulating film in another aspect according to aspects of the present disclosure.

FIG. 10 illustrates an arrangement relationship between a first active layer and a first insulating film in another aspect according to aspects of the present disclosure. The structure of the remaining elements except for the arrangement relationship between the first active layer and the first insulating film may be substantially equal to that of FIG. 5.

In the following description, some configurations, effects etc. of the aspects or examples discussed above may not be repeatedly described for convenience of description. Further, in the following description, like reference numerals will be used for configurations or elements equal to those of aspects or examples described above.

Referring to FIG. 10, a first insulating film 1012 may cover the entire upper surface of the conductive pattern 522 of the first active layer 520, and expose one side surface of the conductive pattern 522 through the second contact hole CH2.

The first insulating film 1012 may be disposed to expose a part of the top surface, and one side surface, of the active pattern 521 of the first active layer 520.

In this instance, the second conductive layer 330 may contact a side surface of the conductive pattern 522 through the second contact hole CH2 of the first insulating film 1012, and be electrically connected to the conductive pattern 522. Further, the second conductive layer 330 may contact the part of the upper surface, and the one side surface, of the active pattern 521 through the second contact hole CH2 of the first insulating film 1012, and be electrically connected to the active pattern.

Meanwhile, in FIGS. 5 to 10, although the structure in which the first active layer (520, 620, 720, 820 or 920) includes the active pattern (521, 621, 721, 821, or 921) and the conductive pattern (522, 622, 722, 822, or 922) have been described; however, the active layer 325 illustrated in FIG. 3 may also include an active pattern and a conductive pattern.

Next, another structure for an area included in the second node N2 of the driving transistor T1 in a sub-pixel of the organic light emitting display device 100 according to aspects described herein will be described with reference to FIG. 11.

Figure 11:
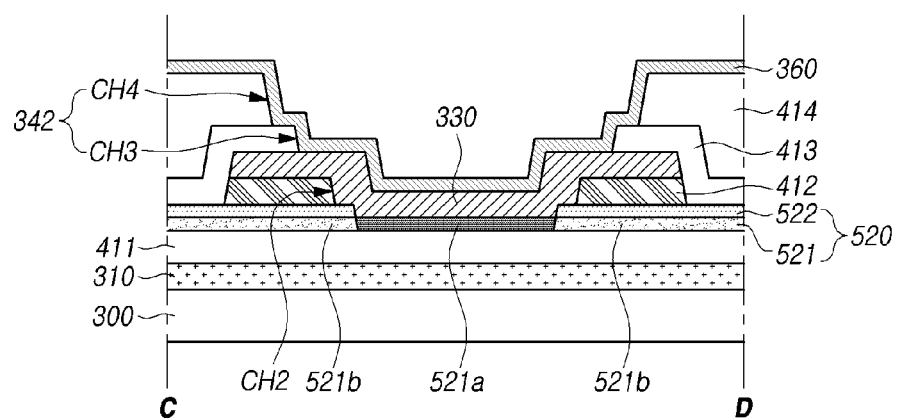
FIG. 11 is a cross-sectional view taken along with line C-D of FIG. 3 according to aspects of the present disclosure.

FIG. 11 is a cross-sectional view taken along with line C-D of FIG. 3 according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

In the following description, a first active layer will be described based on a structure to which the first active layer 520 shown in FIG. 5 is applied.

Referring to FIG. 11, the first conductive layer 310 may be disposed on the substrate 300.

The buffer layer 411 may be disposed on the first conductive layer 310.

The first active layer 520 may be disposed on the buffer layer 411. The first active layer 520 may include an active pattern 521 disposed on the buffer layer 411 and at least one conductive pattern 522 disposed on the active pattern 521.

The first insulating film 412 may be disposed on the first active layer 520.

The first insulating film 412 may be disposed to expose a part of the top surface, and at least one side surface, of the active pattern 521. The first insulating film 412 may be disposed to expose a part of the top surface, and at least one side surface, of the conductive pattern 522.

The active pattern 521 may include a conductive area 521a and a non-conductive area 521b.

Specifically, as shown in FIG. 11, the conductive area 521a of the active pattern 521 may not overlap the first insulating film 412 and may be, or include, an area not overlap the conductive pattern 522.

In another aspect, the conductive area 521a of the active pattern 521 may not overlap the first insulating film 412 and include a partial area overlapping the conductive pattern 522. In another aspect, a part of the conductive area 521a of the active pattern 521 may overlap the first insulating film 412 and the conductive pattern 522.

The conductive area 521a of the active pattern 521 may be formed in the process of forming the first contact hole CH1 in the buffer layer 411 and/or the second contact hole CH2 in the first insulating film 412. A size of the conductive area 521a may vary according to process conditions.

The non-conductive area 521b of the active pattern 521 may be the remaining area except for the conductive area 521a of the active pattern 521.

The conductive pattern 522 of the first active layer 520 may contact a part of the conductive area 521a of the active pattern 521.

The first insulating film 412 may be disposed to expose a part of the top surface, and at least one side surface, of the active pattern 521. The first insulating film 412 may be disposed to expose a part of the top surface, and at least one side surface, of the conductive pattern 522.

The second conductive layer 330 may be disposed over the substrate 300 over which the first insulating film 412 is disposed.

In an area cut along line C-D of FIG. 3, the entire second conductive layer 330 may overlap the first active layer 520.

The second conductive layer 330 may contact a part of the active pattern 521 and a part of the conductive pattern 522 of the first active layer 520 through the second contact hole CH2 formed in the first insulating film 412. Accordingly, the second conductive layer 330 may be electrically connected to the active pattern 521 and the conductive pattern 522 of the first active layer 520.

In the area cut along line C-D of FIG. 3, the buffer layer 411 may not be provided with the first contact hole CH1.

The first contact hole CH1 of the buffer layer 411 may be formed in the same process of forming the second contact hole CH2 in the first insulating film 412 through the dry etching process, and as the first active layer 520 acts as a mask in an area where the first active layer 520 is disposed on the buffer layer 411, thereby, the first active layer 520 can serve to prevent the formation of a contact hole in the buffer layer 411. Thus, as illustrated in FIG. 11, the first contact hole CH1 of the buffer layer 411 may not be formed in an area where the first active layer 520 is disposed on the top surface of the buffer layer 411.

The second insulating film 413 having the third contact hole CH3 and the third insulating film 414 having the fourth contact hole CH4 may be disposed on or over the second conductive layer 330.

The third contact hole CH3 and the fourth contact hole CH4 may be contact holes exposing a portion of the top surface of the second conductive layer 330.

The third conductive layer 360 may be disposed over the substrate 300 over which the third insulating film 414 is disposed.

The third conductive layer 360 may contact the second conductive layer 330 through the third contact hole CH3 and the fourth contact hole CH4. Thus, the third conductive layer 360 may be electrically connected to the second conductive layer 330.

Next, another structure for an area included in the second node N2 of the driving transistor T1 in a sub-pixel of the organic light emitting display device 100 according to aspects described herein will be described with reference to FIG. 12.

Figure 12:
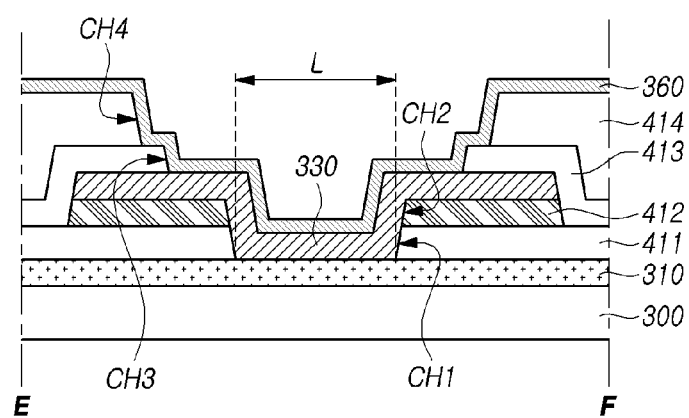
FIG. 12 is a cross-sectional view taken along with line E-F of FIG. 3 according to aspects of the present disclosure.

FIG. 12 is a cross-sectional view taken along with line E-F of FIG. 3 according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

In the following description, a first active layer will be described based on a structure to which the first active layer 520 shown in FIG. 5 is applied.

Referring to FIG. 12, the first conductive layer 310 may be disposed on the substrate 300.

The buffer layer 411 including the first contact hole CH1 may be disposed on the first conductive layer 310. The buffer layer 411 may expose a part of the top surface of the first conductive layer 310 through the first contact hole CH1.

The first insulating film 412 including the second contact hole CH2 may be disposed on the buffer layer 411. The second contact hole CH2 of the first insulating film 412 may overlap the first contact hole CH1 of the buffer layer 411 and expose a part of the top surface of the first conductive layer 310 at the same location as the first contact hole CH1.

The second conductive layer 330 may be disposed over the substrate 300 over which the first insulating film 412 is disposed.

The second insulating film 413 having the third contact hole CH3 and the third insulating film 414 having the fourth contact hole CH4 may be disposed on or over the second conductive layer 330.

The third contact hole CH3 and the fourth contact hole CH4 may be contact holes exposing a portion of the top surface of the second conductive layer 330.

The third conductive layer 360 may be disposed over the substrate 300 over which the third insulating film 414 is disposed.

The third conductive layer 360 may contact the second conductive layer 330 through the third contact hole CH3 and the fourth contact hole CH4. Thus, the third conductive layer 360 may be electrically connected to the second conductive layer 330.

In the area cut along line E-F of FIG. 3, the second conductive layer 330 may not overlap the first active layer 520.

The widths L of the first contact hole CH1 and the second contact hole CH2 may correspond to each other. Here, the width L of the first contact hole CH1 and the second contact hole CH2 may be the maximum length of each contact hole in the first direction of FIG. 3 (for example, the direction in which the data line runs).

As described above, the first contact hole CH1 of the buffer layer 411 and the second contact hole CH2 of the first insulating film 412 may be formed through the same process.

Since the area cut along line E-F shown in FIG. 3 corresponds to an area in which the first active layer 520 is not disposed on the buffer layer 411, the second contact hole CH2 of the insulating film 412 and the first contact hole CH1 of the buffer layer 411 may be formed when the dry etching process is performed.

That is, a location of the first contact hole CH1 of the buffer layer 411 may be determined depending on arrangement relationships between the buffer layer 411 and the first active layer 350 in the area corresponding to the second node N2 of FIG. 2. Accordingly, even when the first contact hole CH1 of the buffer layer 411 and the second contact hole CH2 of the first insulating film 412 are formed by the same process, respective widths of the first contact hole CH1 and the second contact hole CH2 may become partially different.

This is discussed in detail with reference to FIG. 13.

Figure 13:
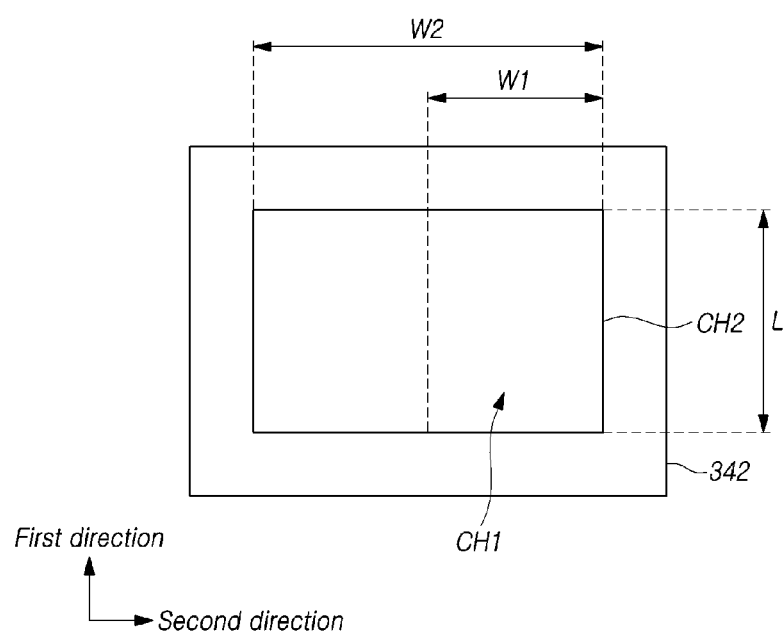
FIG. 13 illustrates positions and widths of contact holes formed in an area included in a second node of a driving transistor of FIG. 2.

FIG. 13 illustrates positions and widths of contact holes formed in an area included in the second node of the driving transistor of FIG. 2.

The first contact hole CH1 may overlap the second contact hole CH2.

The widths L of the first and second contact holes CH1 and CH2 in the first direction may correspond to each other.

The width W1 of the first contact hole CH1 and the width W2 of the second contact hole CH2 in the second direction may be different from each other.

In a plan view, an area of the second contact hole CH2 may be larger than an area of the first contact hole CH1. This is because the first contact hole CH1 may not be formed in an area where the buffer layer overlaps the first active layer.

In other words, an area where the second contact hole CH2 does not overlap the first contact hole CH1 may be an area where the second contact hole CH2 overlaps the first active layer.

Further, contact holes 342 surrounding the first and second contact holes CH1 and CH2 may be disposed. The contact hole 342 may include the third contact hole CH3 of the second insulating film and the fourth contact hole CH4 of the third insulating film, and respective widths of the third contact hole CH3 and the fourth contact hole CH4 may be substantially equal in both the first direction and the second direction, or be different in at least one of the first direction and the second direction.

When respective widths of the third contact hole CH3 and the fourth contact hole CH4 are substantially equal in both the first direction and the second direction, as shown in FIG. 13, respective areas of the third contact hole CH3 and the fourth contact hole CH4 may be substantially equal in a plan view.

When respective widths of the third contact hole CH3 and the fourth contact hole CH4 are different in at least one of the first direction and the second direction, respective areas of the third contact hole CH3 and the fourth contact hole CH4 may be different in the plan view.

In this manner, as at least two of the first to fourth contact holes overlap, an area occupied by the contact holes in the area included in the second node N2 of the driving transistor T1 of FIG. 2. can be reduced.

As described above, the size of the storage capacitor located in the sub-pixel can be increased by reducing the area occupied by the contact holes.

The storage capacitor of the organic light emitting display device 100 according to aspects described herein can include a multi-layered electrode, and thereby, the storage capacitor having high capacity characteristics can be implemented.

A structure of a storage capacitor according to aspects described herein will be discussed with reference to FIG. 14.

Figure 14:
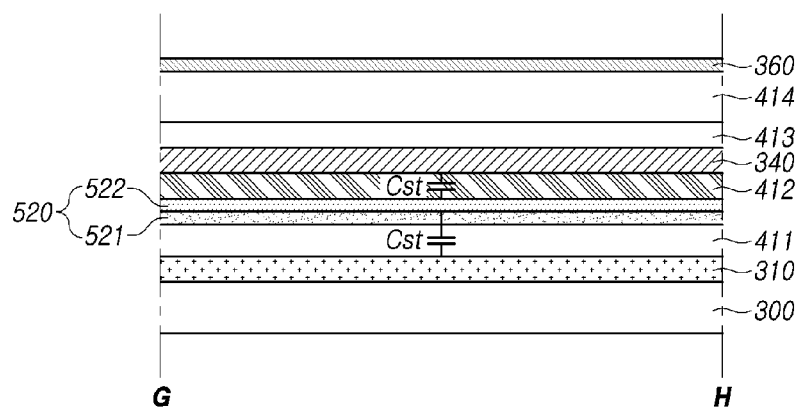
FIG. 14 is a cross-sectional view taken along with line G-H of FIG. 3 according to aspects of the present disclosure.

FIG. 14 is a cross-sectional view taken along with line G-H of FIG. 3 according to aspects of the present disclosure.

In the following description, some configurations, effects etc. of the aspects or examples discussed above may not be repeatedly described for convenience of description. Further, in the following description, like reference numerals will be used for configurations or elements equal to those of aspects or examples described above.

In the following description, a first active layer will be described based on a structure to which the first active layer 520 shown in FIG. 5 is applied.

Referring to FIG. 14, the first conductive layer 310, the buffer layer 411, the active pattern 521 of the first active layer 520, and the conductive pattern 522 of the first active layer 520, the first insulating film 412, the plate 340, the second insulating film 413, the third insulating film 414, and the third conductive layer 360 may be sequentially disposed over the substrate 300.

The plate 340 may be disposed in the same layer as the second conductive layer 330 as described above.

In a situation where one or more layers including an inorganic insulating material are disposed between the first conductive layer 310, the active pattern 521 of the first active layer 520, and the plate 340, each of the first conductive layer 310, the active pattern 521 of the first active layer 520, and the plate 340 are disposed to overlap each other, thereby acting as an electrode of the storage capacitor.

According to aspects described herein, since the first active layer 520 includes the conductive pattern 522, and most of the area in which the plate 340, the first active layer 520, and the first conductive layer 310 overlap is utilized as the storage capacitor Cst, thus, the organic light emitting display device 100 having high-resolution can be implemented.

Although FIG. 14 shows the structure in which the first active layer 520 includes the conductive pattern 522; however, as shown in FIG. 4, the first active layer 520 may have a structure including only the active pattern. In this situation, an area of the active pattern in an area where the storage capacitor is disposed may be a conductive area.

As the storage capacitor of the organic light emitting display device 100 according to aspects described herein has a multi-layer structure, thereby, the storage capacitor having high capacity characteristics can be implemented.

According to aspects described herein, as at least two of the contact holes disposed in the area corresponding to the second node of the driving transistor overlap, and thus, a size or capacity of the storage capacitor can be therefore increased without reducing an area of a light emitting area, and as a result, it is possible to provide an organic light emitting display panel having high luminance and high resolution and an organic light emitting display device including the display panel.

Further, according to aspects described herein, by forming contact holes formed in the buffer layer and the first insulating film through the same process, it is possible to provide an organic light emitting display panel that can be manufactured using a reduced number of marks through a simplified process, and an organic light emitting display device including the display panel.

Further, according to aspects described herein, as the active layer includes the active pattern and the conductive pattern disposed on the active pattern, it is possible to provide the organic light emitting display panel in which sub-pixels can be easily driven and the organic light emitting display device including the display panel.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An organic light emitting display device comprising:
   a substrate;
   a first conductive layer disposed on the substrate;
   a buffer layer disposed on the first conductive layer and including a first contact hole overlapping with a part of the first conductive layer;
   a first active layer disposed on a part of a top surface of the buffer layer;
   a first insulating film disposed on or over the first active layer and the buffer layer and including a second contact hole overlapping with the first contact hole;
   a second conductive layer disposed on the first insulating film, and contacting a part of the first conductive layer and a part of the first active layer through the first contact hole and the second contact hole;
   a second insulating film disposed on the second conductive layer and including a third contact hole overlapping with the first contact hole and the second contact hole; and
   a third conductive layer disposed on the second insulating film and contacting a part of the second conductive layer through the second contact hole,
   wherein the first contact hole, the second contact hole, and the third contact hole overlap with one another.

2. The organic light emitting display device according to claim 1, wherein the first active layer includes at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), and
   wherein an area in which the first active layer overlapping with the second contact hole is an conductive area.

3. The organic light emitting display device according to claim 1, wherein the first active layer includes an active pattern disposed on the buffer layer and at least one layer of a conductive pattern disposed on the active pattern,
   wherein the active pattern includes at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), and
   wherein the conductive pattern includes any one of either a metal or an alloy, the metal includes aluminum (Al), gold (Au), silver (Ag), copper (Cu), tungsten (W), molybdenum (Mo), chromium (Cr), tantalum (Ta), or titanium (Ti), and the alloy includes two or more of aluminum (Al), gold (Au), silver (Ag), copper (Cu), tungsten (W), molybdenum (Mo), chromium (Cr), tantalum (Ta), or titanium (Ti).

4. The organic light emitting display device according to claim 3, wherein the active pattern includes a conductive area and a non-conductive area, and the conductive pattern contacts the conductive area of the active pattern.

5. The organic light emitting display device according to claim 3, wherein the conductive pattern exposes a part of a top surface and at least one side surface of the active pattern.

6. The organic light emitting display device according to claim 3, wherein at least one outer edge of the conductive pattern overlaps with an outer edge of the active pattern.

7. The organic light emitting display device according to claim 3, wherein the active pattern exposes a part of a rear surface of the conductive pattern.

8. The organic light emitting display device according to claim 3, wherein the second conductive layer contacts a part of the conductive pattern and a part of the active pattern through the third contact hole.

9. The organic light emitting display device according to claim 1, wherein the first active layer exposes the part of the top surface of the buffer layer, and the part of the top surface of the buffer layer exposed by the first active layer includes a plurality of protrusions.

10. The organic light emitting display device according to claim 1, wherein a width of the first contact hole in a first direction corresponds to a width of the second contact hole in the first direction, and
    wherein a width of the first contact hole in a second direction intersecting the first direction is smaller than a width of the second contact hole in the second direction.

11. The organic light emitting display device according to claim 1, wherein the third conductive layer is an anode electrode or a cathode electrode of an organic light emitting element.

12. The organic light emitting display device according to claim 1, further comprising a plate disposed in a same layer as the second conductive layer and spaced apart from the second conductive layer, wherein the plate forms a storage capacitor by overlapping with a part of the first conductive layer and the part of the first active layer.

13. The organic light emitting display device according to claim 12, wherein the plate comprises an extension portion overlapping with the part of the active layer, and the extension portion is a first gate electrode of a driving transistor.

14. The organic light emitting display device according to claim 13, wherein an area in which the first contact hole, the second contact hole, and the third contact hole are disposed is an area including a node at which a reference voltage is applied to the driving transistor.

15. The organic light emitting display device according to claim 1, further comprising:
   a second active layer disposed in a same layer as the first active layer, and spaced apart from the first active layer; and
   a second gate electrode disposed over the second active layer and overlapping with a part of the second active layer.

16. The organic light emitting display device according to claim 15, wherein the second gate electrode is electrically connected to a data line.

17. The organic light emitting display device according to claim 15, wherein an area between the first and second active layers overlaps with one or more of a part of the first contact hole, a part of the second contact hole, and a part of the third contact hole.

18. An organic light emitting display panel comprising:
   a substrate;
   a first conductive layer disposed on the substrate;
   a buffer layer disposed on the first conductive layer, and including a first contact hole overlapping a part of the first conductive layer;
   an active layer including an active pattern disposed on the buffer layer and a conductive pattern disposed on the active pattern;
   a first insulating film disposed on or over the active layer and the buffer layer, and including a second contact hole overlapping with the first contact hole;
   a second conductive layer disposed on the first insulating film and contacting the first conductive layer through the first contact hole and the second contact hole; and
   a plate disposed in a same layer as the second conductive layer and spaced apart from the second conductive layer,
   wherein the first conductive layer, the active layer and the plate overlap with one another so that two or more of the first conductive layer, the active layer, and the plate form a storage capacitor.

19. The organic light emitting display panel according to claim 18, further comprising:
   a second insulating film disposed on the second conductive layer, and including a third contact hole overlapping with the first contact hole and the second contact hole; and
   a third insulating film disposed on the second insulating film, and including a fourth contact hole overlapping the third contact hole; and
   a third conductive layer disposed on the third insulating film, and contacting a part of the second conductive layer through the second contact hole and the third contact hole.

20. The organic light emitting display panel according to claim 19, wherein the first contact hole, the second contact hole, and the third contact hole overlap with one another.

* * * * *